(12) United States Patent
Nagatomi et al.

(10) Patent No.: US 7,372,760 B2
(45) Date of Patent: May 13, 2008

(54) SEMICONDUCTOR DEVICE AND ENTRY INTO TEST MODE WITHOUT USE OF UNNECESSARY TERMINAL

(75) Inventors: Yoshiaki Nagatomi, Kawasaki (JP); Kenichi Kawabata, Kawasaki (JP); Norihiro Nakatsuhama, Kawasaki (JP); Tetsuya Yoshida, Kawasaki (JP); Naoya Watanabe, Chuo (JP); Tomohiro Wada, Kawasaki (JP); Tomohide Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 189 days.

(21) Appl. No.: 11/207,935

(22) Filed: Aug. 22, 2005

(65) Prior Publication Data

US 2006/0268636 A1    Nov. 30, 2006

(30) Foreign Application Priority Data

May 27, 2005    (JP) .............................. 2005-156035

(51) Int. Cl.
*G11C 5/14* (2006.01)
(52) U.S. Cl. .................. 365/226; 365/189.07; 365/201
(58) Field of Classification Search .................. 257/48; 324/527, 537, 750, 754, 755, 759, 763, 765; 365/189.03, 201, 189.07, 226; 438/257; 702/120; 714/30, 718
See application file for complete search history.

(56) References Cited

U.S. PATENT DOCUMENTS

| 5,072,138 | A  | * | 12/1991 | Slemmer et al. ............... 326/16 |
| 5,917,765 | A  | * | 6/1999  | Morishita et al. ........... 365/201 |
| 6,373,744 | B1 | * | 4/2002  | Mano ......................... 365/145 |
| 6,550,038 | B2 | * | 4/2003  | Shirata ........................... 716/4 |
| 6,777,707 | B2 | * | 8/2004  | Akiyama et al. .............. 257/48 |
| 6,944,812 | B2 | * | 9/2005  | Chevallier ................... 714/745 |

FOREIGN PATENT DOCUMENTS

| JP | 06-309475 A    | 11/1994 |
| JP | 09-105771 A    | 4/1997  |
| JP | 2001-053232 A  | 2/2001  |

* cited by examiner

*Primary Examiner*—Anh Phung
*Assistant Examiner*—Alexander Sofocleous
(74) *Attorney, Agent, or Firm*—Arent Fox LLP

(57) ABSTRACT

A semiconductor device includes a first power supply terminal, a second power supply terminal, a comparison circuit coupled to the first power supply terminal and the second power supply terminal to produce at an output node thereof a signal responsive to a difference between a potential of the first power supply terminal and a potential of the second power supply terminal, and a core circuit coupled to the output node of the comparison circuit to perform a test operation in response to the signal.

8 Claims, 7 Drawing Sheets

SEMICONDUCTOR DEVICE AND ENTRY INTO TEST MODE WITHOUT USE OF UNNECESSARY TERMINAL

BACKGROUND OF THE INVENTION

1. Field of the Invention

The present invention generally relates to semiconductor devices, and particularly relates to a semiconductor device equipped with a test function and a method of setting a test mode in a semiconductor device.

2. Description of the Related Art

Semiconductor device manufacturers need to test the manufactured semiconductor devices prior to shipment from the factory in order to check whether they operate properly. Semiconductor devices are provided not only with a normal operation mode for exerting the functions that are originally intended for these semiconductor devices, but also with a test mode for performing special functions for test purposes. At the test prior to shipment from the factory, semiconductor devices are controlled to enter such a test mode so as to perform test operations that are different from the normal operations. This serves to check the semiconductor devices.

In the case of a microcontroller implemented as a single chip including a CPU, ROM, RAM, and so on, there is a need to lead some signals to an exterior of the chip for inspection in the test mode while these signals are only transmitted between internal modules such as the CPU, ROM, RAM, and so on during the normal operation mode. In such a microcontroller, an entry into a test mode allows the circuit inside the chip for controlling test operations to operate, and allows the signals transmitted between the internal modules to be transmitted to the exterior from the external terminals of the chip.

FIG. 1 is a drawing showing a mechanism for indicating an entry into a test mode in a semiconductor device having a related-art test mode. A semiconductor device 10 shown in FIG. 1 includes a power supply terminal 11, a power supply terminal 12, a test-purpose signal terminal 13, user terminals 14 through 17, and a power supply terminal 18. The power supply terminals 11 and 12 serve to supply power supply voltages VDD and AVDD, respectively, to the core circuit of the semiconductor device 10. The ground terminal 18 serve to set a ground voltage VSS of the core circuit of the semiconductor device 10 to the same potential as the ground voltage of the external circuit. The user terminals 14 through 17 serve to input/output control signals, data signals, etc., with respect to the core circuit of the semiconductor device 10.

The test-purpose signal terminal 13 is configured to receive a test signal indicative of an entry into a test mode. When the test signal applied from the exterior to the test-purpose signal terminal 13 is set to HIGH, for example, the semiconductor device 10 enters the test mode, thereby performing test operations.

Such a test-purpose signal terminal is only used during the test performed prior to the shipment from the factory by the manufacture of the semiconductor device. After the shipment of the semiconductor device, no user uses this terminal. Namely, the test-purpose signal terminal is a terminal of no use for users.

In respect of a semiconductor device chip, generally, as an attempt is made to increase the number of functions incorporated in the chip, the number of necessary input/output signals increases, resulting in an increase in the number of terminals. Further, as the chip size decreases in response to an increase in the circuit density of a semiconductor device, the size and pitches of the terminals need to be reduced in proportion to the reduction of the chip size. Accordingly, as the function of the semiconductor device becomes sophisticated, and as the circuit density increases, space for arranging the terminals decreases. This results in an increase in the demand that unnecessary terminals should be removed as many as possible.

Moreover, it is desirable to hide the method of entering a test mode from general users, thereby preventing the users having purchased the semiconductor device from using the test mode unpurposely. Further, it is preferable that there is some devised mechanism that avoids an inadvertent entry into a test mode so as to prevent the semiconductor device from entering the test mode by accident.

Patent Document 1 discloses a semiconductor integrated circuit having two power supply systems, which includes a first power supply for use in the core circuit and input buffers and a second power supply for use in the output buffers. After the power-on of the first power supply, a predetermined sequence is given to the second power supply, thereby entering a test mode. Patent Document 2 discloses a semiconductor integrated circuit which enters a test mode based on the result of comparison, which is made between the voltage applied from the exterior to an output terminal electrically coupled to an output of the output driver circuit and either one of the higher power supply voltage or the lower power supply voltage. Patent Document 3 discloses a configuration that generates a test signal for setting the test mode in response to the detection of a specific waveform inside the integrated circuit where a power supply voltage waveform applied in the test mode is controlled.

[Patent Document 1] Japanese Patent Application Publication No. 9-105771

[Patent Document 2] Japanese Patent Application Publication No. 2001-53232

[Patent Document 3] Japanese Patent Application Publication No. 6-309475

Accordingly, there is a need for a semiconductor device that can enter a test mode without requiring the use of an unnecessary terminal.

SUMMARY OF THE INVENTION

It is a general object of the present invention to provide a semiconductor device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages in accordance with the purpose of the invention, the invention provides a semiconductor device which includes a first power supply terminal, a second power supply terminal, a comparison circuit coupled to the first power supply terminal and the second power supply terminal to produce at an output node thereof a signal responsive to a difference between a potential of the first power supply terminal and a potential of the second power supply terminal, and a core circuit coupled to the output node of the comparison circuit to perform a test operation in response to the signal.

According to another aspect of the present invention, a method of setting a test mode in a semiconductor device includes the steps of producing a signal responsive to a difference between a potential of a first power supply terminal and a potential of a second power supply terminal, and setting a core circuit to a test mode in response to the signal.

According to at least one embodiment of the present invention, a potential difference between the plurality of power supply terminals of the semiconductor device is detected, and an entry into the test mode is performed in response to the detection of a potential difference larger than a predetermined level. The power supply terminals that are subjected to such detection are those terminals which supply power supply voltages (including the ground voltage) for driving the core circuit of the semiconductor device, and are used as power supply terminals regardless of whether or not to use the test mode. Accordingly, unlike the case in which a test-purpose signal terminal is separately provided as in the related-art configuration, there is no need to provide an unnecessary terminal dedicated for the test purpose.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
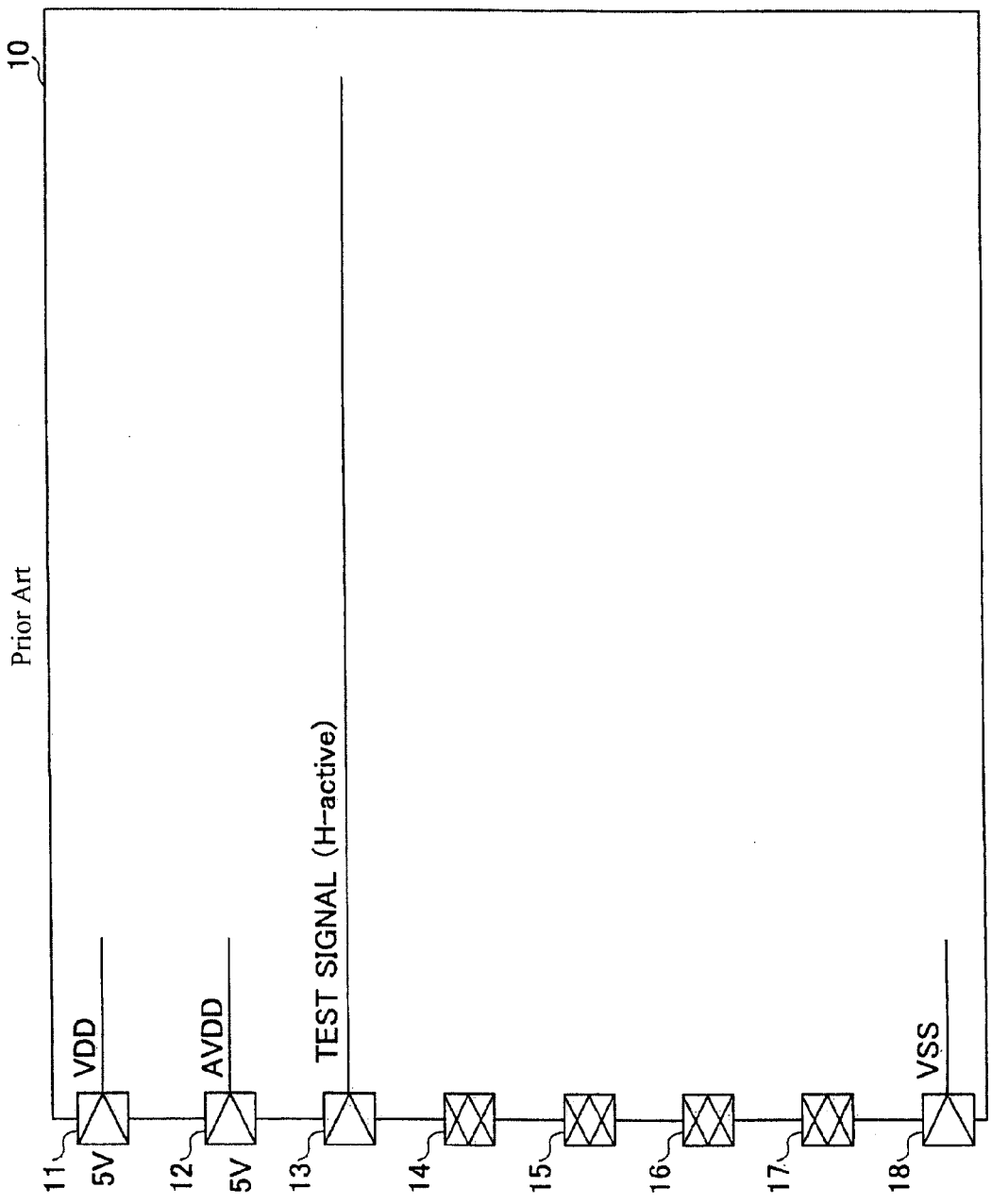
FIG. 1 is a drawing showing a mechanism for indicating an entry into a test mode in a semiconductor device having a related-art test mode.
Figure 2:
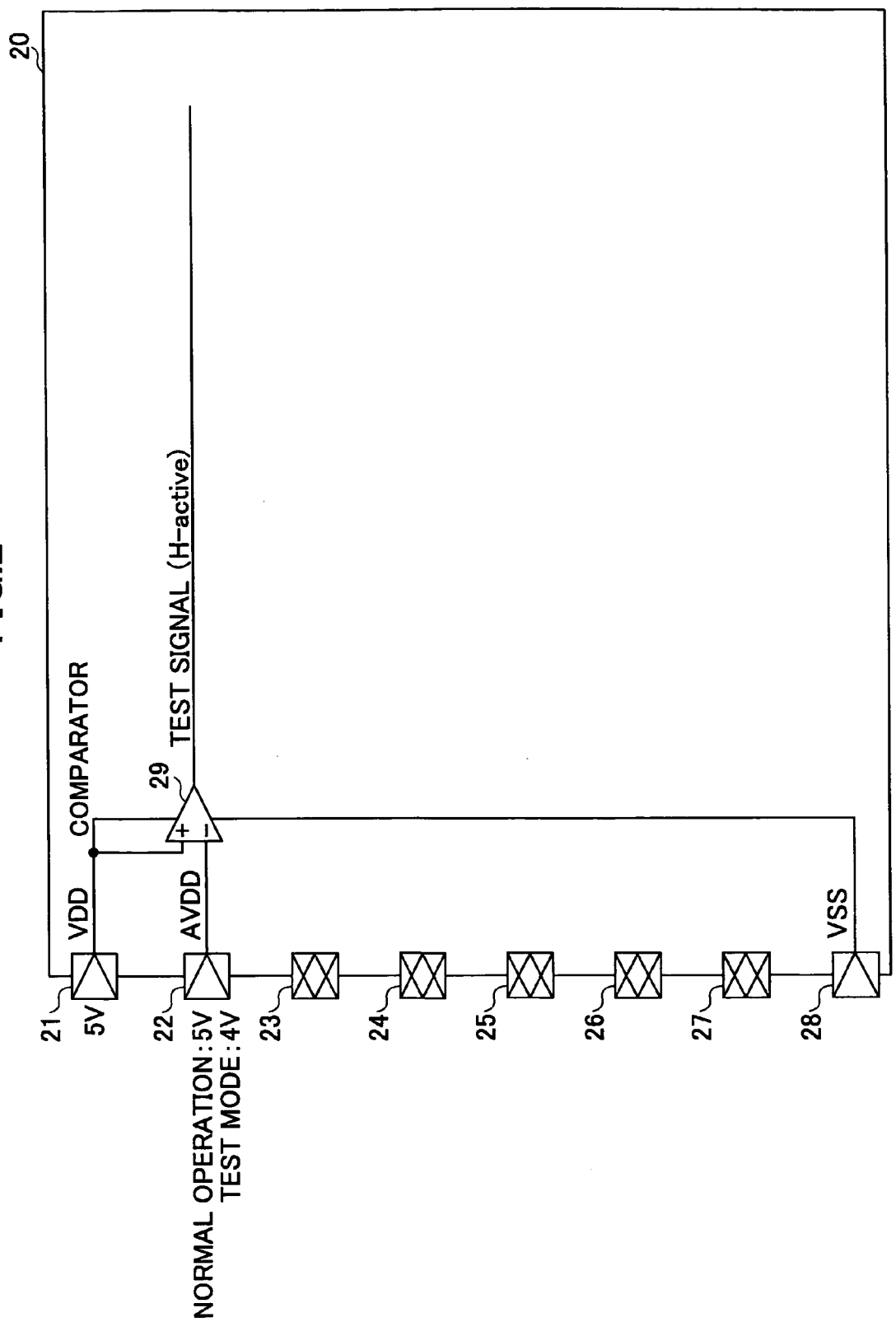
FIG. 2 is a drawing showing a mechanism for indicating an entry into a test mode in a semiconductor device according to the present invention.

FIG. 2 is a drawing showing a mechanism for indicating an entry into a test mode in a semiconductor device according to the present invention. A semiconductor device 20 shown in FIG. 2 includes a power supply terminal 21, a power supply terminal 22, user terminals 23 through 27, a ground terminal 28, and a comparator 29. The power supply terminals 21 and 22 serve to supply power supply voltages VDD and AVDD, respectively, to the core circuit of the semiconductor device 20. The ground terminal 28 serve to set a ground voltage VSS of the core circuit of the semiconductor device 20 to the same potential as the ground voltage of the external circuit. The user terminals 23 through 27 serve to input/output control signals, data signals, etc., with respect to the core circuit of the semiconductor device 20.

The comparator 29 is driven based on the power supply voltage VDD from the power supply terminal 21 and the ground voltage VSS from the ground terminal 28, and compares the power supply voltage VDD from the power supply terminal 21 with the power supply voltage AVDD from the power supply terminal 22. If a difference between the power supply voltage VDD from the power supply terminal 21 and the power supply voltage AVDD from the power supply terminal 22 becomes larger than a predetermined voltage, the comparator 29 sets its output signal serving as a test signal to HIGH. In response to this HIGH test signal, the semiconductor device 20 enters the test mode, thereby performing test operations.

In the example shown in FIG. 2, the power supply voltage VDD from the power supply terminal 21 is set to 5 V regardless whether the normal operation mode is engaged or the test mode is engaged. The power supply voltage AVDD from the power supply terminal 22 is set to 5 V when the normal operation mode is engaged, and is set to 4 V when the test mode is engaged. The comparator 29 sets its output signal serving as a test signal to HIGH if a difference between the power supply voltage VDD and the power supply voltage AVDD from the power supply terminal 22 becomes larger than a predetermined voltage (e.g., 0.9 V). As the test signal becomes HIGH, the semiconductor device 20 enters the test mode, thereby performing test operations.

In the example shown in FIG. 2, a voltage difference between the power supply terminal 21 and the power supply terminal 22 is used as a basis for determining whether to enter the test mode. Alternatively, a voltage difference between the ground terminal 28 on the ground-voltage side and another terminal (e.g., the power supply terminal 22) may be used as a basis to determine whether to enter the test mode.

According to the present invention as described above, a potential difference between a plurality of power supply terminals of the semiconductor device is detected, and an entry into the test mode is performed in response to the detection of a potential difference larger than a predetermined level. The power supply terminals that are subjected to such detection are those terminals which supply power supply voltages (including the ground voltage) for driving the core circuit of the semiconductor device, and are used as power supply terminals regardless of whether or not to use the test mode. Accordingly, unlike the case in which a test-purpose signal terminal is separately provided as in the related-art configuration, there is no need to provide an unnecessary terminal dedicated for the test purpose.

Further, unlike the case in which a test-purpose signal terminal is separately provided as in the related-art configuration, how to enter the test mode is not apparent to users. As a result, in no cases, may the users having purchased the semiconductor device use the test mode unpurposely. It is conceivable that the potential of a single power supply terminal is detected and used as a basis for determining whether to enter the test mode. However, such a configuration leaves open the possibility that an entry into the test mode is accidentally made when the power supply voltage fluctuates during the normal operations. In the present invention, on the other hand, a potential difference between a plurality of power supply terminals is detected. Even when the power supply voltages fluctuate, all the power supply terminals tend to exhibit similar potential fluctuations. The risk of entering the test mode by accident in response to the detection of a potential difference is thus low.

Figure 3:
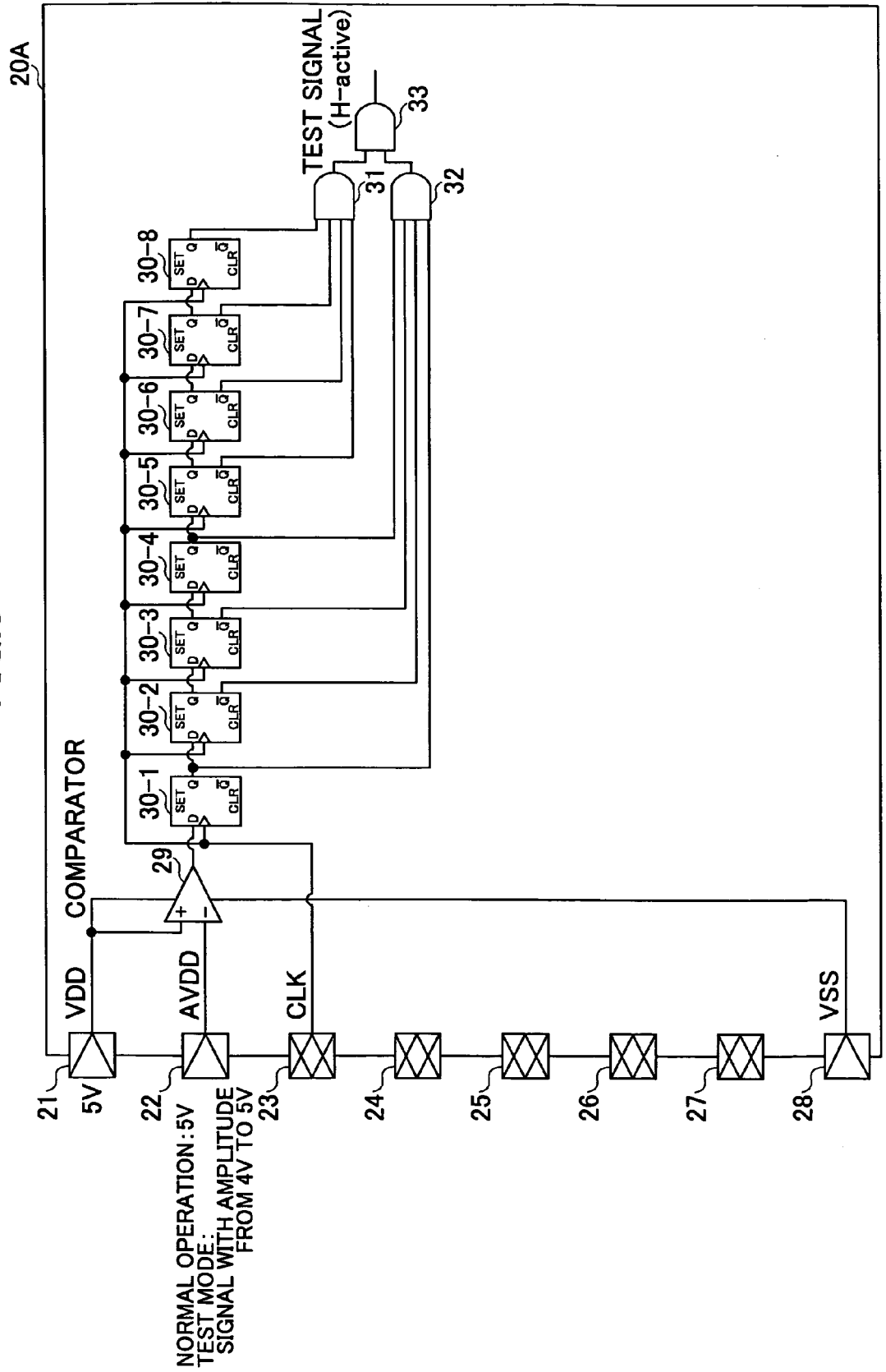
FIG. 3 is a drawing showing a variation of the mechanism for indicating an entry into a test mode in the semiconductor device according to the present invention.

FIG. 3 is a drawing showing a variation of the mechanism for indicating an entry into a test mode in the semiconductor device according to the present invention. In FIG. 3, the same elements as those of FIG. 2 are referred to by the same numerals, and a description thereof will be omitted.

A semiconductor device 20A shown in FIG. 3 includes the power supply terminal 21, the power supply terminal 22, the user terminals 23 through 27, the ground terminal 28, the comparator 29, flip-flops 30-1 through 30-8, and AND gates 31 through 33. The comparator 29 produces its output signal in response to the result of comparison between the power supply voltage VDD from the power supply terminal 21 and the ground voltage VSS from the ground terminal 28, and supplies the output signal to the flip-flop 30-1 as input data. The flip-flops 30-1 through 30-8 receive a clock signal CLK from the user terminal 23, and load the input data in synchronization with the clock signal CLK. The flip-flops 30-1 through 30-8 are connected such that the output data of each stage is supplied as input data into the next stage, thereby constituting a 8-stage shift register. Through the loading of input data in synchronization with the clock signal CLK, the flip-flops 30-1 through 30-8 successively store and shift the outputs indicative of comparison results for consecutive clock cycles output from the comparator 29.

The AND gates 31 through 33 constitute a decoder circuit. The AND gate 32 receives a non-inverted output, inverted output, inverted output, and non-inverted output of the respective flip-flops 30-1 through 30-4, and sets its output to HIGH if all of the inputs are HIGH. The AND gate 31 receives an inverted output, non-inverted output, inverted output, and non-inverted output of the respective flip-flops 30-5 through 30-8, and sets its output to HIGH if all of these inputs are HIGH. The AND gate 33 sets its output to HIGH if the output of the AND gate 31 and the output of the AND gate 32 are both HIGH. The output of the AND gate 33 is supplied to the core circuit as a test signal. With this provision, the semiconductor device 20 enters the test mode as the test signal becomes HIGH, thereby performing test operations.

Figure 4:
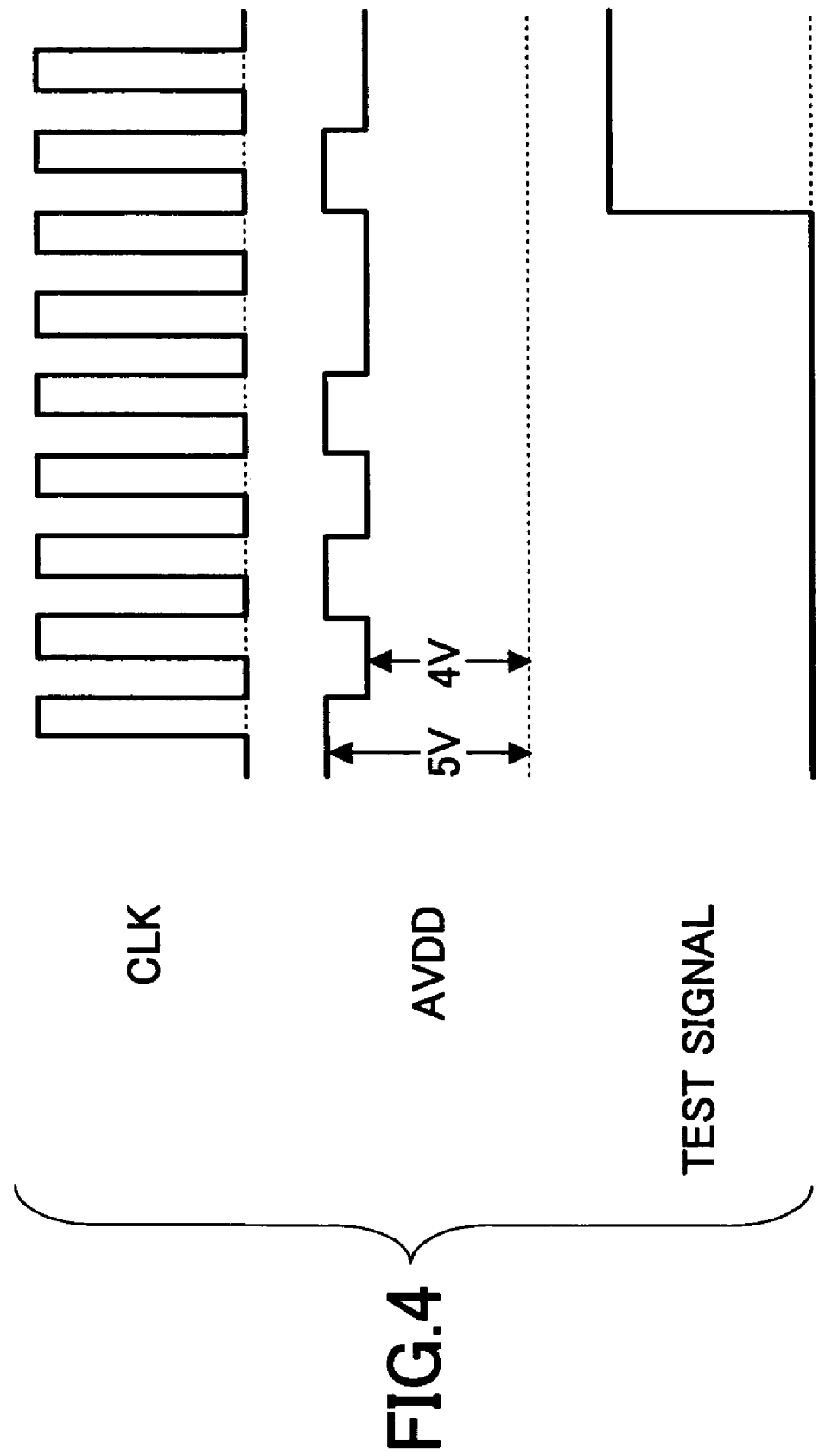
FIG. 4 is a signal timing chart for explaining the operation to enter a test mode in the semiconductor device shown in FIG. 3.

FIG. 4 is a signal timing chart for explaining the operation to enter a test mode in the semiconductor device shown in FIG. 3. As shown in FIG. 4, the power supply voltage AVDD supplied from the exterior to the power supply terminal 22 is changed in synchronization with the clock pulses of the clock signal CLK. In the example shown in FIG. 4, the power supply voltage AVDD is changed within the range from 4 V to 5 V.

The sequence of voltage values comprised of 5 V and 4 V of the power supply voltage AVDD as shown in FIG. 4 is stored in the flip-flops 30-1 through 30-8 as a data sequence comprised of "1"s and "0"s. If the data sequence stored in the flip-flops 30-1 through 30-8 matches a predetermined sequence, the decoder comprised of the AND gates 31 through 33 changes its output signal serving as a test signal to HIGH as shown in FIG. 4.

In the configuration shown in FIG. 3 as described above, the results of comparisons between the power supply voltage VDD and the power supply voltage AVDD are stored over the 8 clock cycles of the clock signal CLK, and the test signal is asserted to HIGH only if the 8 results of comparisons for the 8 clock cycles matches the predetermined pattern. With this provision, it is possible to reduce the risk of entering the test mode by accident in response to the fluctuation of the power supply voltages.

Figure 5:
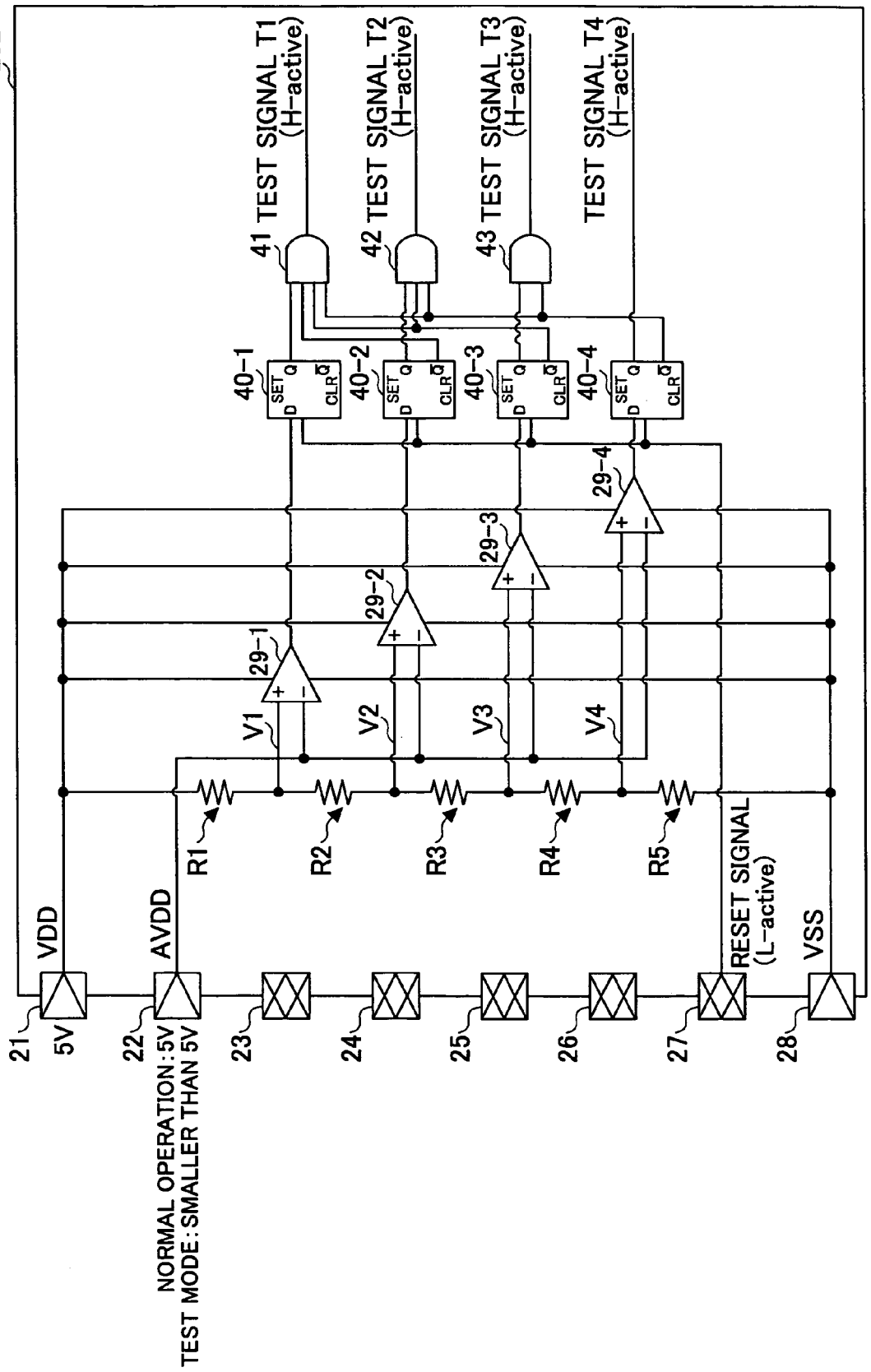
FIG. 5 is a drawing showing a variation of the mechanism for indicating an entry into a test mode in the semiconductor device according to the present invention.

FIG. 5 is a drawing showing a variation of the mechanism for indicating an entry into a test mode in the semiconductor device according to the present invention. In FIG. 5, the same elements as those of FIG. 2 are referred to by the same numerals, and a description thereof will be omitted.

A semiconductor device 20B shown in FIG. 5 includes the power supply terminal 21, the power supply terminal 22, the user terminals 23 through 27, the ground terminal 28, comparators 29-1 through 29-4, flip-flops 40-1 through 40-4, AND gates 41 through 43, and resistors R1 through R5. The resistors R1 through R5 are connected in series between the power supply voltage VDD and the ground voltage VSS so as to constitute a potential divider. The potential divider divides the power supply voltage VDD to generate potentials V1 through V4, which are different from each other. The potentials V1 through V4 are supplied to one input of the comparators 29-1 through 29-4, respectively. The other input of the comparators 29-1 through 29-4 receives the power supply voltage AVDD. The power supply voltage AVDD is set to a potential equal to or larger than 0 V and smaller than 5 V.

The comparators 29-1 through 29-4 compare the respective potentials V1 through V4 from the potential divider with the power supply voltage AVDD from the power supply terminal 22, and produce output signals responsive to the results of comparisons. Assuming that the resistances of the resistors R1 through R5 are equal, the potential V1 is $(4/5)$VDD. The comparator 29-1 compares this potential V1 with the power supply voltage AVDD, and sets its output to HIGH if the power supply voltage AVDD is lower than the potential V1. Further, the potential V2 is $(3/5)$VDD. The comparator 29-2 compares this potential V2 with the power supply voltage AVDD, and sets its output to HIGH if the power supply voltage AVDD is lower than the potential V2. The potential V3 is $(2/5)$VDD. The comparator 29-3 compares this potential V3 with the power supply voltage AVDD, and sets its output to HIGH if the power supply voltage AVDD is lower than the potential V3. Moreover, the potential V4 is $(1/5)$VDD. The comparator 29-4 compares this potential V4 with the power supply voltage AVDD, and sets its output to HIGH if the power supply voltage AVDD is lower than the potential V4.

The output signals of the comparators 29-1 through 29-4 are supplied as data inputs to the flip-flops 40-1 through 40-4, respectively. The flip-flops 40-1 through 40-4 receive a reset signal from the user terminal 27, and load the data inputs at a rising edge of the reset signal.

A non-inverted output, inverted output, inverted output, and inverted output of the respective flip-flops 40-1 through 40-4 are supplied to the AND gate 41. Accordingly, if the data stored in the flip-flops 40-1 through 40-4 are "1", "0", "0", and "0", respectively, a first test signal T1 output from the AND gate 41 is set to HIGH.

A non-inverted output, inverted output, and inverted output of the respective flip-flops 40-2 through 40-4 are supplied to the AND gate 42. Accordingly, if the data stored in the flip-flops 40-2 through 40-4 are "1", "0", and "0", respectively, a second test signal T2 output from the AND gate 42 is set to HIGH.

A non-inverted output and inverted output of the respective flip-flops 40-3 and 40-4 are supplied to the AND gate 43. Accordingly, if the data stored in the flip-flops 40-3 and 40-4 are "1" and "0", respectively, a third test signal T3 output from the AND gate 43 is set to HIGH. Further, the non-inverted output of the flip-flop 40-4 is supplied to a subsequent stage as a fourth test signal T4.

With this provision, all the first through fourth test signals T1 through T4 are LOW if the power supply voltage AVDD is equal to or larger than (4/5)VDD. If the power supply voltage AVDD is equal to or larger than (3/5)VDD and smaller than (4/5)VDD, the first test signal T1 is asserted to HIGH. If the power supply voltage AVDD is equal to or larger than (2/5)VDD and smaller than (3/5)VDD, the second test signal T2 is asserted to HIGH. Further, if the power supply voltage AVDD is equal to or larger than (1/5)VDD and smaller than (2/5)VDD, the third test signal T3 is asserted to HIGH. Moreover, if the power supply voltage AVDD is smaller than (1/5)VDD, the fourth test signal T4 is asserted to HIGH.

As the first test signal T1 is set to HIGH, the semiconductor device 20B enters the first test mode, thereby performing a first test operation. As the second test signal T2 is set to HIGH, the semiconductor device 20B enters the second test mode, thereby performing a second test operation. As the third test signal T3 is set to HIGH, the semiconductor device 20B enters the third test mode, thereby performing a third test operation. As the fourth test signal T4 is set to HIGH, the semiconductor device 20B enters the fourth test mode, thereby performing a fourth test operation.

Figure 6:
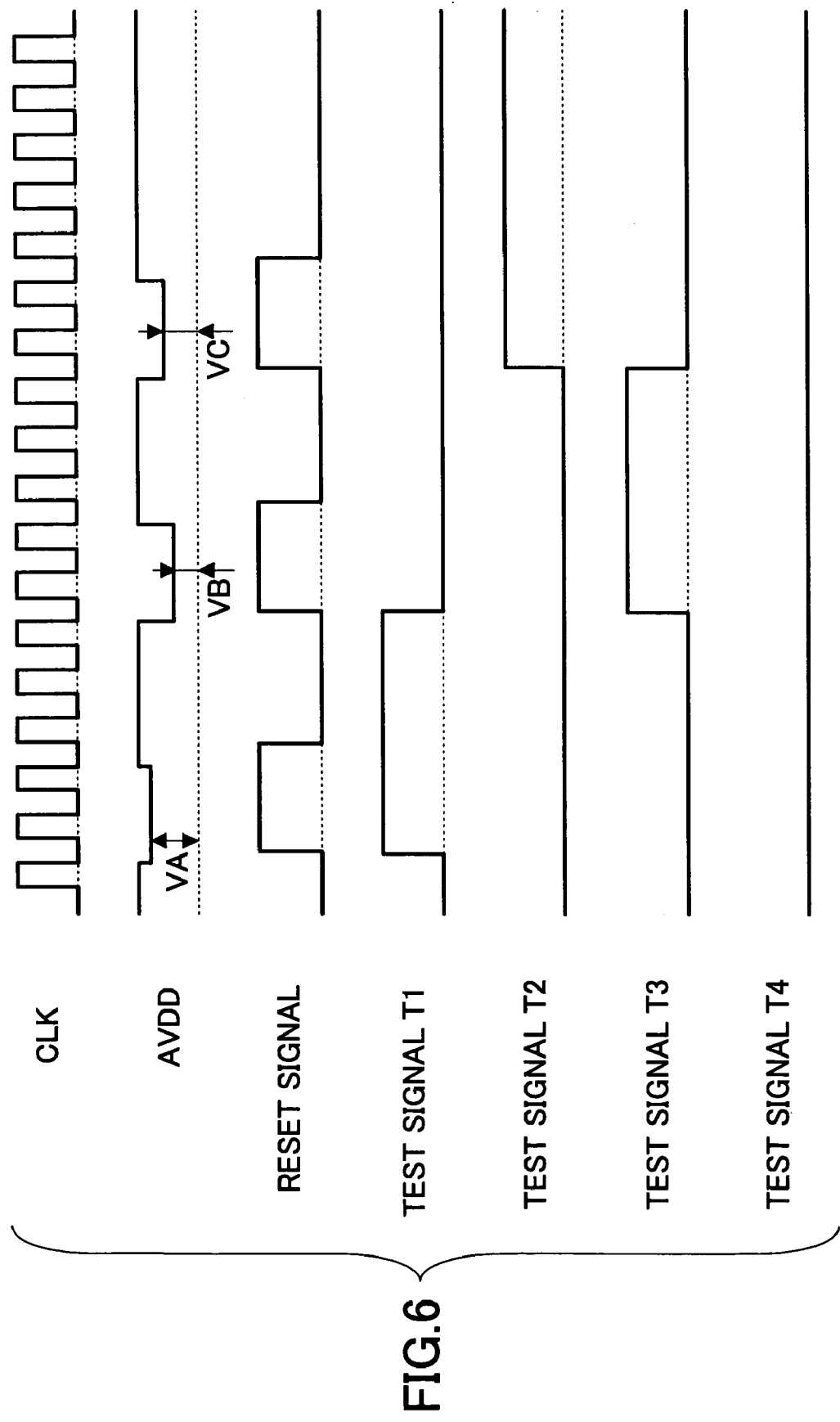
FIG. 6 is a signal timing chart for explaining the operation to enter a test mode in the semiconductor device shown in FIG. 5.

FIG. 6 is a signal timing chart for explaining the operation to enter a test mode in the semiconductor device shown in FIG. 5. As shown in FIG. 6, the power supply voltage AVDD supplied from the exterior to the power supply terminal 22 is changed in synchronization with the clock pulses of the clock signal CLK. In the example shown in FIG. 6, the power supply voltage AVDD is changed to a plurality of different potential levels.

Data (i.e., a type of thermometer code) corresponding to the potential level of the power supply voltage AVDD shown in FIG. 6 is stored in the flip-flops 40-1 through 40-4 at the positive transition of the reset signal. The data stored in the flip-flops 40-1 through 40-4 is decoded to generate the first through fourth test signals.

In the example shown in FIG. 6, the first test signal T1 is set to HIGH in response to a potential VA of the power supply voltage AVDD, and the third test signal T3 is set to HIGH in response to a potential VB of the power supply voltage AVDD. Further, the second test signal T2 is set to HIGH in response to a potential VC of the power supply voltage AVDD.

In the configuration shown in FIG. 5 as described above, the plurality of reference potentials generated through the potential division of the power supply voltage VDD are used so as to generate and store a code representing the potential level of the power supply voltage AVDD. This code is decoded such as to assert a test signal to HIGH that corresponds to the potential level of the power supply voltage AVDD among the plurality of test signals. With this provision, it is possible to select one of the plurality of test modes (one of the plurality of test operations), and perform the selected one.

The configuration shown in FIG. 3 may be combined with the configuration shown in FIG. 5 such that one of the plurality of test operations that corresponds to the potential level of the power supply voltage AVDD is selected, and also such that the relevant test signal is asserted to HIGH only when the time sequence of the potential level of the power supply voltage AVDD matches a predetermined pattern. With this provision, it is possible to enter one of the plurality of test modes selectively and also to reduce the risk of entering the test mode by accident in response to the fluctuation of the power supply voltage.

Figure 7:
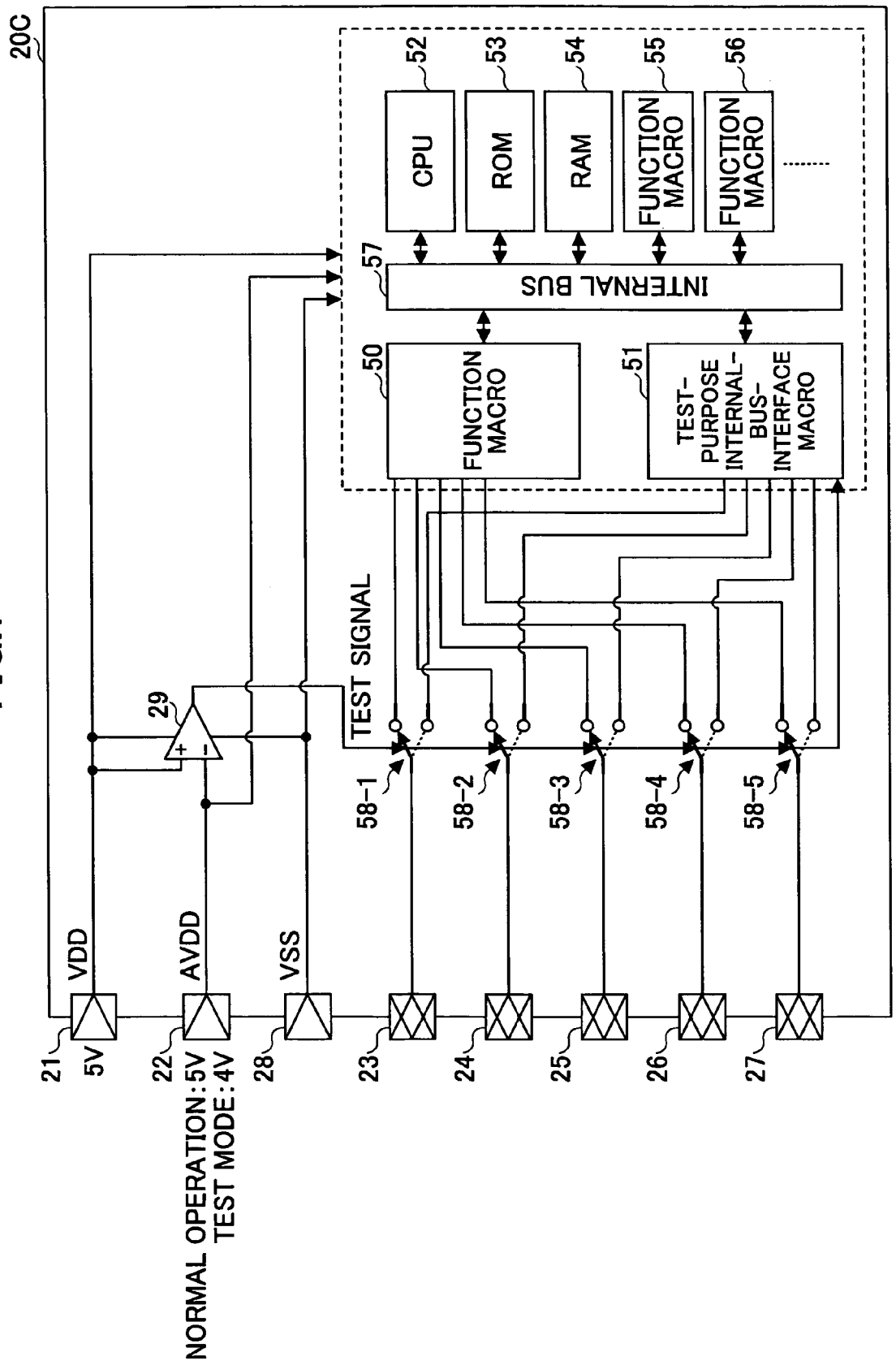
FIG. 7 is a drawing showing an example of the overall configuration of a semiconductor device to which the mechanism for indicating an entry into a test mode as shown in FIG. 2 is applied.

FIG. 7 is a drawing showing an example of the overall configuration of a semiconductor device to which the mechanism for indicating an entry into a test mode as shown in FIG. 2 is applied. In FIG. 7, the same elements as those of FIG. 2 are referred to by the same numerals, and a description thereof will be omitted.

A semiconductor device 20C shown in FIG. 7 includes the power supply terminal 21, the power supply terminal 22, the user terminals 23 through 27, the ground terminal 28, the comparator 29, a function macro 50, a test-purpose internal-bus-interface macro 51, a CPU 52, a ROM 53, a RAM 54, a function macro 55, a function macro 56, an internal bus 57, and switch circuits 58-1 through 58-5. The power supply terminals 21 and 22 serve to supply the power supply voltages VDD and AVDD, respectively, to the core circuit of the semiconductor device 20C. The ground terminal 28 serve to set a ground voltage VSS of the core circuit of the semiconductor device 20C to the same potential as the ground voltage of the external circuit. The user terminals 23 through 27 are used in the normal operation mode for the input/output of signals with respect to the function macro 50, which is one of the core circuits of the semiconductor device 20C.

The semiconductor device 20C is designed as a microcontroller that is implemented as a single chip including a CPU, ROM, RAM, and so on. The function macro 50, CPU 52, ROM 53, RAM 54, function macro 55, and function macro 56 are coupled to each other via the internal bus 57, and exchange data with each other through the internal bus 57. The exchange of data between the function macro 50, CPU 52, ROM 53, RAM 54, function macro 55, and function macro 56 does not have to be observed from outside the semiconductor device 20C in the normal operation mode. Provision is thus made such that it is impossible to access, from outside, the ROM 53, RAM 54, function macro 55, function macro 56, or the like in the normal operation mode to access the stored data directly.

In the test operation mode, on the other hand, data stored in the internal modules such as the ROM 53, RAM 54, function macro 55, and function macro 56 need to be led to outside for examination. The test-purpose internal-bus-interface macro 51 is provided for this purpose. As the test signal output from the comparator 29 is asserted, the test-purpose internal-bus-interface macro 51 starts test operations, and supplies the data transmitted on the internal bus 57 to the switch circuits 58-1 through 58-5 as such need arises.

In the example shown in FIG. 7, the power supply voltage VDD from the power supply terminal 21 is set to 5 V regardless whether the normal operation mode is engaged or the test mode is engaged. The power supply voltage AVDD from the power supply terminal 22 is set to 5 V when the normal operation mode is engaged, and is set to 4 V when the test mode is engaged. The comparator 29 place its output signal serving as a test signal in an asserted state if a difference between the power supply voltage VDD and the power supply voltage AVDD from the power supply terminal 22 becomes larger than a predetermined voltage (e.g., 0.9 V).

The switch circuits 58-1 through 58-5 couple the user terminals 23 through 27 to the function macro 50 in the normal operation mode during which the test signal output from the comparator 29 is kept in the negated state. When the test signal output from the comparator 29 is placed in the asserted state to indicate the test mode, the switch circuits 58-1 through 58-5 change their switch connections so as to couple the user terminals 23 through 27 to the test-purpose internal-bus-interface macro 51.

Accordingly, data stored in the internal modules such as the ROM 53, RAM 54, function macro 55, and function macro 56 are led to outside for inspection in the test mode via the test-purpose internal-bus-interface macro 51, the switch circuits 58-1 through 58-5, and the user terminals 23 through 27. The configuration shown in FIG. 7 may be combined with the configuration shown in FIG. 3 and/or the configuration shown in FIG. 5.

In the present invention as described above, a potential difference between the plurality of power supply terminals of the semiconductor device is detected, and an entry into the test mode is performed in response to the detection of a potential difference larger than a predetermined level. The power supply terminals that are subjected to such detection are those terminals which supply power supply voltages (including the ground voltage) for driving the core circuit of the semiconductor device, and are used as power supply terminals regardless of whether or not to use the test mode. Accordingly, unlike the case in which a test-purpose signal terminal is separately provided as in the related-art configuration, there is no need to provide an unnecessary terminal dedicated for the test purpose.

Further, the present invention is not limited to these embodiments, but various variations and modifications may be made without departing from the scope of the present invention.

The present application is based on Japanese priority application No. 2005-156035 filed on May 27, 2005, with the Japanese Patent Office, the entire contents of which are hereby incorporated by reference.

What is claimed is:

1. A semiconductor device, comprising:
a first power supply terminal;
a second power supply terminal;
a comparison circuit coupled to said first power supply terminal and said second power supply terminal to produce at an output node thereof a signal responsive to a difference between a potential of said first power supply terminal and a potential of said second power supply terminal; and
a core circuit coupled to the output node of said comparison circuit to perform a selected one of a test operation and a normal operation in response to said signal,
wherein the potential of said first power supply terminal and the potential of said second power supply terminal are supplied to said core circuit as power supply voltages during both the test operation mode and the normal operation mode.

2. A semiconductor device, comprising:
a first power supply terminal;
a second power supply terminal;
a comparison circuit coupled to said first power supply terminal and said second power supply terminal to produce at an output node thereof a signal responsive to a difference between a potential of said first power supply terminal and a potential of said second power supply terminal;
a core circuit coupled to the output node of said comparison circuit to perform a test operation in response to said signal;
a shift register coupled to the output node of said comparison circuit to store a time sequence of said signal; and a decode circuit coupled to said shift register to produce at an output node thereof a decode value made by decoding the time sequence stored in said shift register,
wherein said core circuit is coupled to the output node of said decode circuit to perform the test operation in response to said decode value.

3. A semiconductor device, comprising:
a first power supply terminal;
a second power supply terminal;
a comparison circuit coupled to said first power supply terminal and said second power supply terminal to produce at an output node thereof a signal responsive to a difference between a potential of said first power supply terminal and a potential of said second power supply terminal; and
a core circuit coupled to the output node of said comparison circuit to perform a test operation in response to said signal,
wherein said comparison circuit is configured to output a plurality of signals responsive to the difference between the potential of said first power supply terminal and the potential of said second power supply terminal, and said core circuit is configured to select and perform one of a plurality of test operations in response to the plurality of signals.

4. The semiconductor device as claimed in claim 3, wherein said comparison circuit further includes:
a potential divider configured to divide the potential of said first power supply terminal to generate a plurality of reference potentials;
a plurality of comparators configured to generate said plurality of signals, respectively, in response to comparison between the plurality of reference potentials and the potential of said second power supply terminal; and
a decode circuit configured to generate at an output node thereof a decode value made by decoding said plurality of signals,
wherein said core circuit is coupled to the output node of said decode circuit to select and perform one of the plurality of test operations in response to said decode value.

5. A method of setting a test mode in a semiconductor device, comprising the steps of:
a) producing a signal responsive to a difference between a potential of a first power supply terminal and a potential of a second power supply terminal;
b) setting a core circuit to a selected one of a test mode and a normal mode in response to said signal; and
driving the core circuit by use of the potential of the first power supply terminal and the potential of the second power supply terminal as power supply voltages in both the test mode and the normal mode.

6. A method of setting a test mode in a semiconductor device, comprising the steps of:
a) producing a signal responsive to a difference between a potential of a first power supply terminal and a potential of a second power supply terminal;
b) setting a core circuit to a test mode in response to said signal
c) storing a time sequence of said signal in memory; and
d) producing a decode value made by decoding the time sequence stored in the memory,
wherein said step b) sets the core circuit to the test mode in response to the decode value.

7. A method of setting a test mode in a semiconductor device, comprising the steps of:

a) producing a signal responsive to a difference between a potential of a first power supply terminal and a potential of a second power supply terminal;

b) setting a core circuit to a test mode in response to said signal wherein said step a) outputs a plurality of signals responsive to the difference between the potential of said first power supply terminal and the potential of said second power supply terminal, and wherein said step b) selects one of a plurality of test modes in response to the plurality of signals and sets the core circuit to the selected test mode.

8. The method as claimed in claim 7, wherein said step a) includes the steps of:

dividing the potential of the first power supply terminal to generate a plurality of reference potentials;

generating said plurality of signals in response to comparison between the plurality of reference potentials and the potential of the second power supply terminal; and generating a decode value made by decoding said plurality of signals, wherein said step b) selects one of the plurality of test modes in response to said decode value and sets the core circuit to the selected test mode.

* * * * *